HIGH FREQUENCY OSCILLATOR AND RESONATOR

Filed Feb. 4, 1952 3 Sheets-Sheet 1

INVENTORS
WILLIAM D. MYERS
HOWARD M. ZEIDLER
BY Flehr & Swain
ATTORNEYS

May 22, 1956 W. D. MYERS ET AL 2,747,098

HIGH FREQUENCY OSCILLATOR AND RESONATOR

Filed Feb. 4, 1952 3 Sheets-Sheet 2

INVENTORS
WILLIAM D. MYERS
HOWARD M. ZEIDLER
BY
[signature]
ATTORNEYS

May 22, 1956 W. D. MYERS ET AL 2,747,098

HIGH FREQUENCY OSCILLATOR AND RESONATOR

Filed Feb. 4, 1952 3 Sheets-Sheet 3

INVENTORS
WILLIAM D. MYERS
HOWARD M. ZEIDLER
BY
Flehr & Swain
ATTORNEYS

United States Patent Office 2,747,098

Patented May 22, 1956

2,747,098

HIGH FREQUENCY OSCILLATOR AND RESONATOR

William D. Myers, Los Altos, and Howard M. Zeidler, Palo Alto, Calif., assignors to Hewlett-Packard Company, Palo Alto, Calif., a corporation of California Application February 4, 1952, Serial No. 269,878

10 Claims. (Cl. 250—36)

This invention relates to high frequency oscillators and to resonators for use in such oscillators which are capable of being tuned over wide frequency ranges and which may also include means for suppressing undesired modes of oscillation.

In microwave oscillation generating systems of a type which must be capable of being tuned over wide frequency ranges it has been common to employ coaxial line resonators operating in the fundamental or TEM mode of wave propagation in conjunction with a reflex klystron oscillator tube. A common difficulty encountered in such a system is the presence of undesired oscillation modes, i. e. the tube is capable of oscillating at two distinct frequencies for one setting of repeller voltage and plunger position of the coaxial line resonator. A number of techniques have been developed in the past for suppressing the undesired mode or modes of oscillation so that for a single setting of repeller voltage and resonator plunger position only one frequency of oscillation is possible. These techniques have generally included some type of coaxial "stub" or its equivalent which operates in the same mode of wave propagation as the resonator, normally the TEM mode. This "stub" introduces a reactance which is different for the two frequencies which are desired to be separated. If a sufficient change in reactance is introduced, only the desired frequency will be produced at the specified repeller voltage and resonator tuning position. More complex techniques are required to maintain the difference in reactance for the necessary range of plunger positions required for broad band operation. These difficulties are particularly accentuated in very high frequency oscillators where the small size of the cavity makes the construction of such devices very difficult.

A further difficulty which is encountered in constructing a wide tuning range coaxial resonator is the presence of higher order modes of wave propagation in the coaxial line. These higher order modes produce undesired resonances which cause frequency discontinuities and greatly reduce the Q of the principal mode resonance. These resonances may either occur in the main resonator or in supplementary parts of the resonator, such as the space surrounding a non-contacting plunger or in the oscillation mode suppressor "stub." In general, such resonances in the main resonator cannot be satisfactorily suppressed over a wide tuning range, hence the main resonator must be designed to be of such a size that no higher order resonances occur within the desired range of frequencies. Parasitic resonances associated with the plunger or the oscillation mode suppressor "stub" are commonly permitted to fall within the desired tuning range and suppressed by the use of slots filled with lossy material which serve to damp out the higher order parasitic resonances without affecting the fundamental mode resonance.

The present invention is predicated on the discovery that it is possible to actually utilize the higher order "parasitic" resonances associated with the space surrounding a non-contacting plunger to suppress the undesired oscillation modes of the oscillator. The plunger resonances can be made to track with the undesired oscillation mode and thus, instead of being sources of difficulty, these higher order resonances can be made to perform a useful function. By use of the technique to be described the construction of a coaxial line resonator can be considerably simplified, since there is no longer any necessity for a mode suppressor "stub" with its accompanying slots to damp out parasitic resonances. When parasitic plunger resonances are not needed for oscillation mode suppression, they can, by use of the techniques to be described, be removed from the desired operating range of frequencies so that they do not interfere with the desired oscillation modes. The techniques to be described are particularly suitable for very high frequency oscillation generators, at frequencies such as 7,000 mc., where close tolerances and small parts are required, because of the simplicity and compactness of devices built according to these techniques.

In general it is an object of the invention to provide a high frequency oscillator and cavity resonator for the same which will facilitate adjustment and operation over a wide frequency range.

Another object of the invention is to provide means for utilizing higher order coaxial line resonances associated with the plunger gap of a coaxial line oscillator to suppress undesired modes of oscillation.

Another object of this invention is to eliminate the necessity for conventional oscillation mode suppression stubs.

A further object of this invention is to provide a reflex klystron oscillator resonator having wide tuning range, relatively simple construction, positive oscillation mode suppression means, and no frequency discontinuities due to higher order coaxial line resonances.

Other objects of this invention will appear more fully from the following description in which a preferred embodiment of the invention has been set forth in detail in conjunction with the accompanying drawings.

Referring to the drawings.

Figure 1:
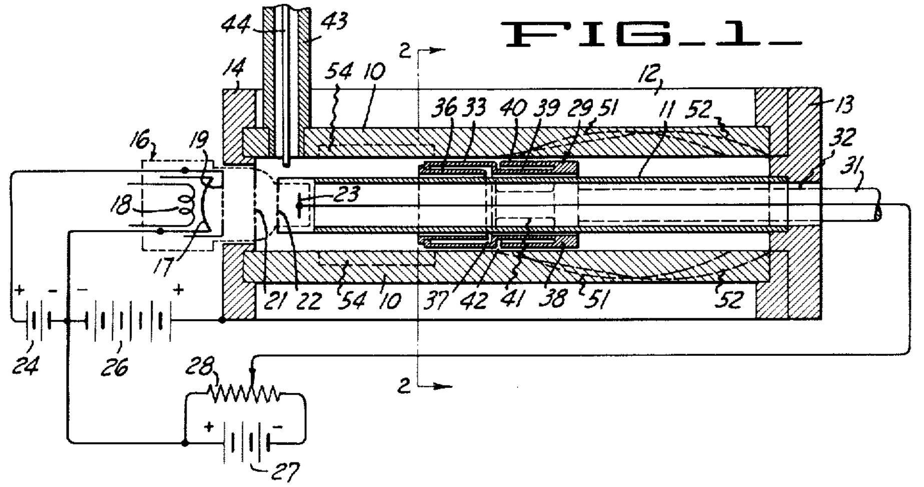
Figure 1 is a side elevational view in section of the basic oscillator circuit and the resonator cavity, the cavity being shown as a section taken along the line 1—1 of Figure 2.
Figure 2A:
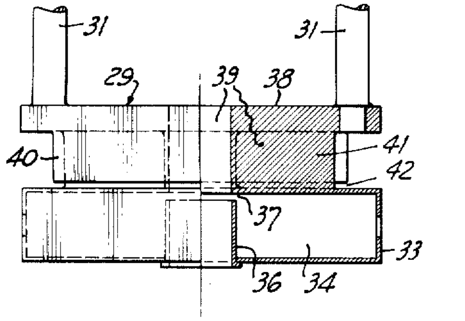
Figure 2A is a half cross-sectional view looking down at the top of the plunger and taken along the line **2*a*—2*a*** in Figure 2.
Figure 2:
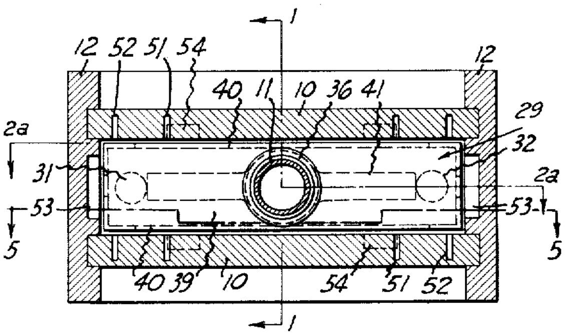
Figure 2 is a cross-sectional view along the lines 2—2 in Figure 1.

Referring first to Figures 1, 2, 2A, 5, 6, 7 and 8, the cavity resonator employed consists of a pair of conducting plates or slab-like walls 10, together with a conducting center conductor 11. The plates 10 are parallel to each other, and also parallel to and equally spaced from the axis of the center conductor 11. The margins of the walls 10 extend for a substantial distance beyond the outermost portion of the center conductor 11, as shown in Figure 2. In practice, it is desirable that the lateral extent of each of the side walls 10 be more than twice the spacing between these walls. The two side edges of the cavity could be left open, since the electric field in the cavity is strongly concentrated between the center conductor 11 and the walls 10 in the region near the center conductor and the field is very weak near the side edges. However, to permit the use of a relatively small size cavity without radiation and for other reasons to be explained, the side edges are closed by the conducting walls 12. As will be shown, the spacing of the walls 12 from the axis of the center conductor 11 may be of considerable importance in designing mode suppression means for the cavity.

A rear metal wall 13 provides a mounting for center conductor 11 and is fastened to the walls 10 and the side walls 12. At the forward end of the cavity the walls 10 are attached to the end wall 14, which provides a mounting for the reflex klystron tube 16 indicated schematically in Figure 1. The elements of the klystron tube include the cathode 17 which is heated by the filament 18, the control grid 19, a pair of resonator grids 21 and 22, and a repeller 23. A battery or other source of voltage 24 has its negative side connected to the cathode 17 and its positive side connected to the control grid 19. A second battery 26 has its positive side connected to the resonator and wall 14 and its negative side connected to the cathode 17. The two resonator grids 21 and 22 are connected to the cavity for purposes of D. C. continuity, grid 21 making connection to end wall 14 and grid 22 making connection to center conductor 11. The center conductor is connected to the end wall 14, to establish a direct current connection, through the rear metal wall 13 and the walls 10 and 12. A third battery 27 has its positive side connected to the cathode 17 and to one end of potentiometer resistor 28. Battery 27 has its negative side connected to the other end of resistor 28. The repeller electrode 23 is maintained at a negative potential with respect to the cathode 17 by a tap on potentiometer resistor 28. The reflex klystron tube may be of a standard design, such as the tube known by manufacturer's specifications as No. 5721 (Raytheon).

An adjustable non-contacting plunger 29 is fitted within the cavity to permit adjustment of the frequency of operation. The plunger may be of the Z type as shown in Figures 1, 2, and 2A, and does not touch either the walls 10 and 12 or the inner conductor 11. The clearance between the surface of the plunger and the outer and inner conductors must be very small, e. g. of the order of 0.010 inch. To maintain this clearance for all plunger positions, the plunger 29 is supported at the rear by the rods 31 which are slidably fitted in and maintained in accurate alignment by the rear portion of the plunger 29 which is made of an insulating material such as bakelite and which is fitted snugly to the inner surface of the cavity. In addition it may be desirable to separate the plunger 29 from the inner conductor 11 by means of a suitable dielectric sleeve, not shown. The front portion 33 of the plunger is a hollow block (Figure 2A), the inner surface forming a cavity 34 with a rectangular outer conductor and a round inner conductor 36. Entrance to this cavity is obtained from a small annular slot 37 surrounding the inner conductor 11. This cavity in the front plunger portion 33 acts to provide a broadband short at the front of the plunger, between the inner conductor 11 and the plunger 29. The rear portion 38 of the plunger is somewhat different from the front portion 33. A hollow cavity 39 is formed between the outer rectangular part 40, the inner part 41 and the front and back walls of the rear portion 38. The spacing between the parts 40 and 41 is relatively small in the center cross section of Figure 1, but increases to about one-third of the spacing between the slab walls 10 further from the axis of the center conductor 11, as shown in Figures 2 and 2A. It is not necessary to continue this cavity out to the edges near walls 12, because the field in this region is very weak and has little effect. Entrance to the cavity 39 is obtained from a slot 42 between the outer part 40 and the rear part of the front body portion 33. Cavity 39 provides an effective short circuit between the front of the plunger and slab walls 10.

The operation of the Z type non-contacting plunger is well known to those skilled in the art and it will not be explained here. See, for example, W. H. Huggins, "Broad-band non-contacting short circuits for coaxial lines," Proc. I. R. E., v. 35, p. 906, 1087, 1324, September, October and November 1947. One difference between the plungers commonly used and the plunger employed in the circuit of this invention is the change in geometry from a purely cylindrical system to the system shown in Figures 1, 2, and 2A with a rectangular slab type outer conductor and a round inner conductor.

The output signal is removed from the cavity by suitable means such as a coaxial line mounted in one of the walls 10 and including an outer conductor 43 and an inner conductor 44. The inner conductor 44 extends into the cavity past the surface of the adjacent wall 10 to pick up signal energy in the cavity.

Figures 4, 5, 6, 7, 8:
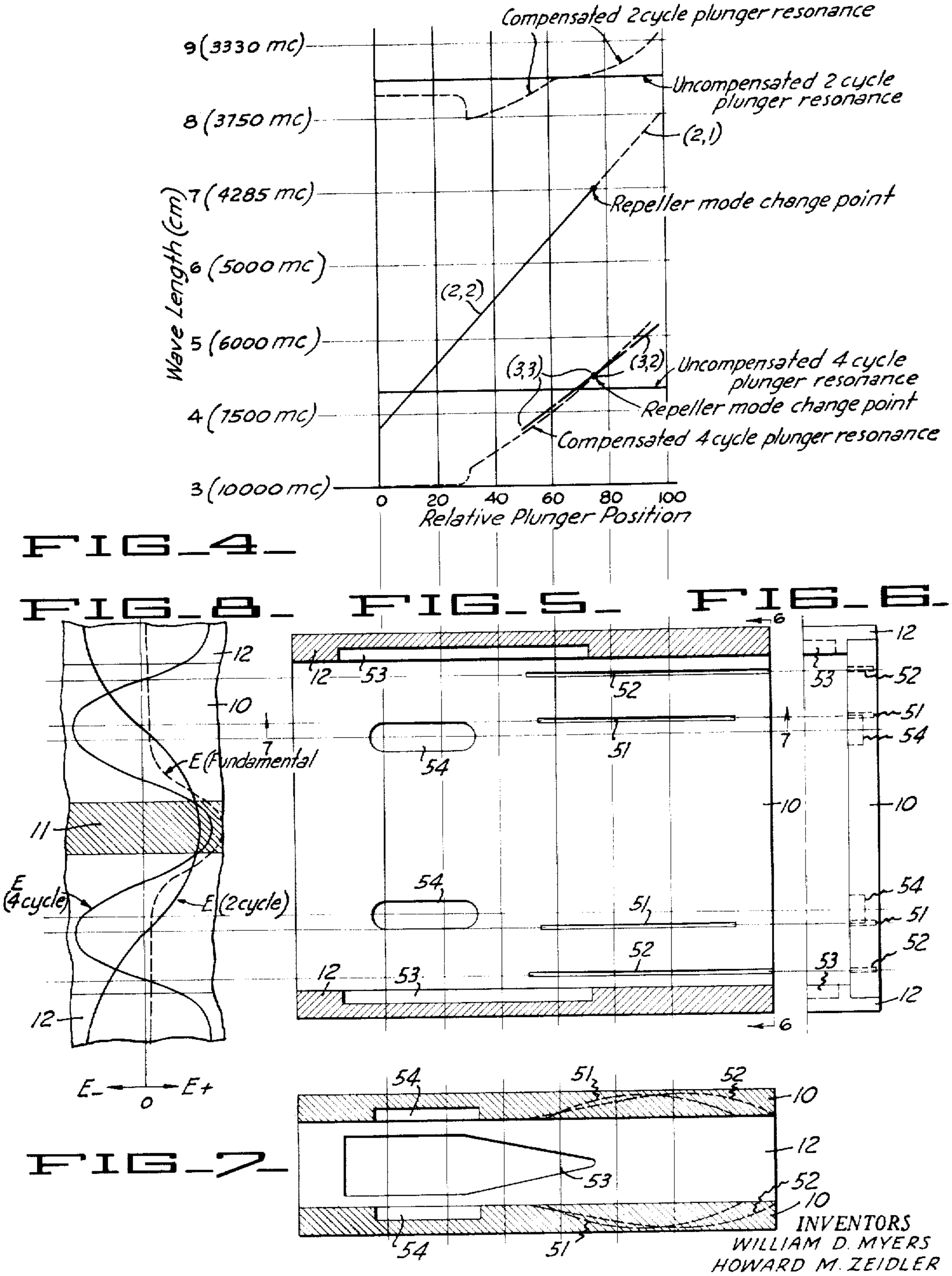
Figure 4 is another type of oscillation mode plot for the Figure 1 oscillator showing the wave length of oscillation as a function of resonator length, with and without mode suppression according to the present invention.
Figure 5 is a cross-sectional view of the bottom half of the outer conductor of the Figure 1 cavity, showing mode suppression means to accomplish the results shown in Figure 4.
Figure 6 is an end view of the part of the cavity shown in Figure 5 taken along the line 6—6 in Figure 5.
Figure 7 is a cross-sectional view of the cavity of Figure 5 taken along the line 7—7 in Figure 5 and including both top and bottom halves of the cavity.
Figure 8 is an unfolded view of a part of the Figure 5 cavity also including a cross-sectional view of a part of the center conductor of the cavity and showing the variation in electric field strength for the main field and for two higher order circumferential resonances shown in Figure 4, as a function of distance around the outer conductor.

Mode suppressor slots 51, 52 and 54 are cut in the slab walls 10 and mode suppressor slots 53 are cut in the walls 12. Slots 51 and 52 preferably are of varying depth as shown in Figures 1 and 7, and are of constant width, as shown in Figures 2 and 6. The slots 53 preferably are of varying width, as shown in Figure 7, but of constant depth, as shown in Figure 5. The slots 54 are of constant depth, as shown in Figure 7, and of constant width, except for rounding at the ends to permit easier fabrication, as shown in Figure 5.

The operation of the circuit shown in Figures 1 and 2 can be best explained by reference to Figure 3, which is a partial mode plot of the oscillator of Figures 1 and 2. Each of the shaded regions represents a different mode of oscillation. For any given mode, this plot means that, at any combination of repeller voltage and resonator length which corresponds to a point within the shaded region of that mode, the circuit will oscillate. The designation of the modes, (3, 2), (3, 3), etc., refers to the electrical length of the resonator and to the number of cycles of travel in the region near the repeller that an electron makes after leaving the resonator grids before being returned. The first number refers to the length of the resonator and the second to the number of cycles in the repeller region. For example, the (3, 2) mode refers to a mode in which the resonator is 5/4 wavelength long and in which there are 2¾ cycles in the repeller drift space. This notation is standard in the art. For present purposes, it is important to note the presence in Figure 3 of two different modes of oscillation near each setting of repeller voltage that may be chosen. At the long wavelength end of the band (large resonator length), the (3, 2) and (2, 1) modes are almost completely superposed. As the resonator length is shortened and the repeller voltage is abruptly changed, as shown, so that operation in the (2, 2) mode is obtained, there is danger of undesired oscillation in the (3, 3) mode that closely follows the (2, 2) mode. The practical effect obtained from this situation is that at nearly any setting of the plunger, the circuit will tend to oscillate at either of two frequencies, depending on the impedance offered by the resonator. In a typical condition the circuit may oscillate at one frequency for a time and then shift to a different frequency in the other mode. This effect is especially pronounced in pulsed operation.

Figure 3:
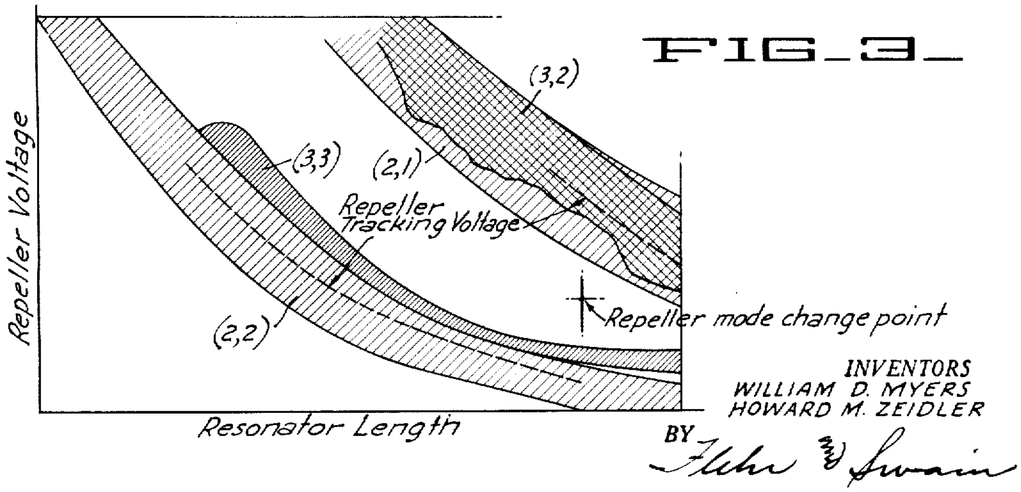
Figure 3 is a partial oscillation mode plot of the Figure 1 oscillator circuit showing repeller voltage as a function of resonator length.

In the past, where ordinary coaxial lines with round inner and outer conductors have been employed to obtain wide tuning ranges, the mode suppression problem illustrated in Figure 3 has been solved by introducing a coaxial stub line at some point along the resonator which introduces a reactance into the impedance presented by the resonator to the beam. This amounts to changing the mode plot of Figure 3 so that the various modes are widely enough separated to permit operation in a single mode at a time. To accomplish this result over a wide frequency range often involves the use of a multiplicity of stub lines with very carefully controlled characteristics. It has been discovered that if a non-contacting plunger is used in conjunction with a parallel plane resonator, there is no necessity for such techniques. According to the present invention, instead of changing the shapes and positions of the modes in the manner just described, the undesired modes of oscillation are damped out over the frequency ranges of interest and the desired modes are left unaffected by means now to be described.

Referring to Figure 4, the wavelength of oscillation in the various modes of Figure 3 is plotted against relative plunger position, which is the equivalent of resonator length in Figure 3. The desired modes of oscillation are the (2, 1) and (2, 2) which form a straight line in Figure 4 running from 3750 mc. to about 7600 mc. over a range of plunger positions from 0 to 100. What is desired is that the frequencies of oscillation indicated by this line should be the only possible frequencies of oscillation for the indicated plunger positions and the corresponding repeller voltages given in Figure 3. The undesired modes, (3, 2) and (3, 3), are indicated by the dashed line (long dashes) running from about 6000 mc. to 8000 mc. over the range of plunger positions from about 48 to 100 in Figure 4. It will now be explained how these undesired modes are suppressed by use of a higher order circumferential plunger resonance, and how undesired plunger resonances may be prevented from interfering with operation in the desired modes.

In an ordinary round coaxial line, the zero order or fundamental mode of wave propagation has a field pattern which is uniform in amplitude and phase for all circumferential positions, at any given cross-section and radial position. A higher order mode is one in which circumferential variations exist, the numbers of variations specifying the order of the mode. At frequencies higher than the frequency at which some mean circumference is equal to one free-space wavelength, the first order mode can propagate. Other higher modes become possible at frequencies corresponding to two, three, four, etc. wavelengths per mean circumference. In the case of a parallel plane line, similar modes are possible, but the frequency at which they become possible depends on a differently defined mean circumference which is essentially independent of the outer circumference of the line. A resonator constructed from either type line is normally designed to be small enough so that no higher order modes can propagate in the main section of line at the highest frequency of operation. However, it is often inconvenient to make the resonator small enough to avoid the existence of higher order modes in the space between the outer surface of the non-contacting plunger and the outer conductor of the line. This space can be considered to act as a section of coaxial line with the same outer conductor as the main line and with the outer surface of the plunger as the center conductor. At a frequency at or above the cutoff frequency for any given higher order mode in this region, this section of line will resonate in the given mode and absorb power from the main section of line. Depending on the impedances presented by the plunger internal shorted line and the front and back sections of the main resonator, there will be one or more resonances near the cutoff frequency for each higher order mode that is excited. It was observed in the case of the rectangular parallel plane line of Figures 1 and 2 that only one resonance per higher order mode occurred, and that this resonance occurred almost exactly at the cutoff frequency of each mode.

In an ordinary round line, there is no preference for any of the higher order modes that can exist in the plunger gap or clearance, nor is there any specifiable orientation of the modes, i. e. the maxima of electric field may assume any angular orientation and may be different for different modes, depending on slight constructional irregularities. In the case of the parallel plane line, however, there is a very definite preference for even order modes, and these even order modes have a very precise orientation. Only even order modes can be excited at all in a reasonably accurately aligned parallel plane line plunger gap. This is so because the exciting field in the main part of the line always has an electric field which is concentrated strongly in the region near the center of the line between outer and inner conductor and this strong region of exciting field always is directed either outward from inner to outer conductor on both sides or inward from outer to inner conductor on both sides. Only those higher order modes in the plunger gap that have maxima of electric field in the same direction as the principal mode field near the center of the main line, can be excited. This requires that all of the higher order modes in a parallel plane line plunger gap have an even number of half guide wavelengths per half circumference of the plunger, i. e. an even number of guide wavelengths per plunger circumference in order to be excited. Thus, at or near frequencies at which the outer circumference of the plunger is two, four, six, etc., free space wavelengths in length, higher order resonant modes will occur.

In one typical example of a resonator as shown in Figures 1 and 2, the plunger 29 was 17 cm. in circumference. The two cycles per circumeference resonance occurred at a wavelength of 8.5 cm. and the 4 cycle resonance at 4.25 cm. as predicted. These resonances are shown in Figure 4 as horizontal solid lines at the stated wavelengths. The only odd order mode resonances that were observed were of very small amplitude and did not interfere with the operation of the circuit.

Figure 8 is an unfolded view of a section of one-half of the outer conductor, consisting of one wall 10, and one-half of each wall 12 folded out into the same plane as the slab 10. A cross-sectional view of the center conductor 11 is also included for reference. The amplitude for the electric field strength of the second and fourth cycle plunger resonances is shown in Figure 3 as a function of distances around the outer conductor. The amplitude of the electric field of the fundamental wave is also shown by a dotted line. As seen, all three modes have maxima in the same direction opposite the center conductor, as explained above. Because of the fixed orientation of the maxima in a parallel plane line, the entire field pattern, as shown in Figure 8, is fixed and predetermined. This is an important property of the parallel plane line, because it makes it possible to vary the frequency of resonance of the higher order modes in the outer plunger gap by very precise amounts by the use of slots in the outer conductor of the main line. The precise action of a slot in the outer conductor may be predicted because its position relative to the maxima and minima of electric field in the plunger gap is known in advance, and it will not vary due to slight irregularities in construction, as it would in a simple round line.

The operation of the slots in Figures 5, 6 and 7 to give the results shown in Figure 4 will now be explained. Figures 4, 5 and 7 are aligned with each other vertically so that for any given plunger position in Figure 4, the equivalent plunger position in Figures 5 and 7 lies directly below the number in Figure 4 specifying the plunger position in Figure 4. The "Equivalent plunger position" is approximately the front face of the plunger for all positions. Figures 5, 6, and 8 are aligned horizontally. The circuit of Figures 5, 6, and 7 is, of course, only a particular example of the invention designed to meet the needs of an oscillator using the particularly reflex klystron tube having mode characteristics of Figures 3 and 4. The explanation of the operation of this particular circuit will, however, demonstrate the principles of the invention and show how the same principles can be applied in any basically analogous system. Referring to Figure 4, it is seen that the undesired (3, 2) and (3, 3) modes occur in the frequency range near the uncompensated 4-cycle plunger resonance. Referring now to Figure 8, it is seen that the 4-cycle plunger resonance has electric field zeros and hence current maxima near the walls 12 in line with the slots 52. The slots 52 are designed to increase the resonant wavelength of the 4-cycle plunger resonance, so that it will track the (3, 2) and (3, 3) modes over the range of plunger positions from 100 to about 70. As seen from Figure 7, the depth of the slot 52 continually decreases over this range of plunger positions. As will be explained, this type of slot causes a resonant wavelength increase proportional to its depth. The resulting compensated 4-cycle plunger resonance closely follows the undesired (3, 2) and (3, 3) modes in the 70 to 100 range of plunger positions, as shown in Figure 4. The result is to completely suppress oscillation in these modes over the specified range of plunger positions by absorbing power from the main resonator line in the plunger gap and causing a continuous "hole" for the undesired modes of oscillation. In the range of plunger positions from 70 to 50, it is necessary to decrease the resonant wavelength of the 4-cycle plunger resonance to a value lower than the uncompensated value. This is accomplished by the slots 53 in the walls 12 of the resonator which are centered at maxima of the electric field of the 4-cycle resonance, as seen from Figures 7 and 8. The width of the slots 53 is made proportional to the desired wavelength deviation over the range of plunger positions 50 to 70. The resulting compensated 4-cycle resonance in this region tracks the (3, 3) mode, as seen in Figure 4.

Figure 9:
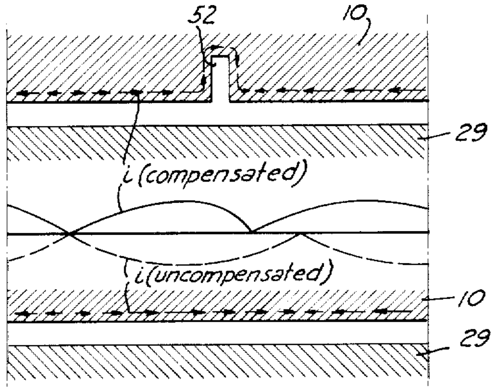
Figure 9 is a cross-sectional view of a part of the plunger and outer conductor of the resonator of Figure 5 for two plunger positions, and also shows the current in the outer conductor as a function of distance around the plunger.

The operation of these slots is best explained by reference to Figures 9 and 10. Referring to Figure 9, part of the plunger gap between the slab wall 10 and the plunger 29 is shown in two views for two plunger positions, the upper view being for a plunger position where the slot 52 is present, such as the plunger position 90, and the lower view being for a plunger position where there is no slot 52, such as the plunger position 40. The current in the outer conductor 10 is shown in both views as a function of distance along the plunger gap for a higher order mode. The arrows shown in the slab wall 10 indicate the presence of current in this wall having an amplitude proportional to the length of the arrows and a direction of flow corresponding to the direction of the arrows. The amplitude of the current is plotted below the upper view as a solid line for the case where a slot is present. The dotted line plot of current amplitude is for the case where no slot is present, shown in the lower view.

For the case where no slot is present, the current follows a sinusoidal variation, as shown in the lower view of Figure 9. For the case where the slot is present, shown in the upper view of Figure 9, the sinusoidal variation is distorted in the region of the slot. The current essentially follows the surface of the wall, since it is concentrated very near the surface of any conductor at high frequencies. Thus, if the slot is located near a current maximum as shown, the current must travel a longer path in going around the slot and the electrical distance around the plunger gap will be made longer. Since the plunger gap is effectively longer, the plunger gap will have a somewhat lower resonant frequency with the gap than without it. It should be noted that if the gap occurs at a current minimum for some given frequency, the gap will have almost no effect at all, if it has a width small in comparison with the wavelength. In this case the current simply dies out at each edge of the slot and there is no appreciable change in the effective electrical length and hence no appreciable change in the resonant frequency. It is this property of this type of gap that permits the selective adjustment of the resonant frequency of one higher order mode without changing the frequency of another.

Figure 10:
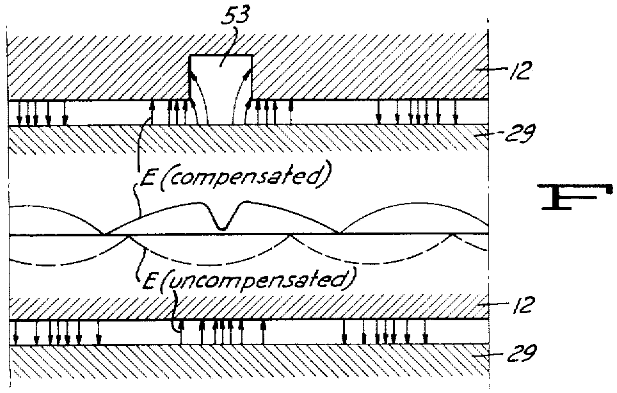
Figure 10 is a cross-sectional view of a part of the plunger and outer conductor of the resonator of Figure 5 for two plunger positions and also shows the electric field between said outer conductor and plunger as a function of distance around the plunger.

Referring now to Figure 10, part of the plunger gap between the wall 12 and the plunger 29 is shown in two views for two plunger positions, the upper view being for a plunger position where the slot 53 is present, such as the plunger position 60, and the lower view being for a plunger position where the slot 53 is not present, such as the plunger position 90. The electric field between the plunger 29 and the wall 12 is shown as a function of circumferential distance in both views. The arrows between the two conductors indicate an electric field having a direction corresponding to the direction of the arrows and a magnitude proportional to the density of arrows at any point. The amplitude of electric field is plotted below the upper view as a solid line for the case where a slot is present. The dotted line plot of electric field amplitude is for the case where no slot is present, shown in the lower view.

In the uncompensated case, the lower view of Figure 10, the field has a sinusoidal spatial variation. When the slot 53 is present, the field pattern is distorted in the region of the slot. If the slot is reasonably deep, on the order of several times the spacing between the plunger 29 and the outer conductor walls, the field will be interrupted in the center of the slot and the amplitude of the field will be reduced to a very low value in the center of the slot. The field will now go to a maximum near each edge of the slot, if, in the absence of the slot, a maximum occurred in the position corresponding to the center of the slot. The result is to decrease the electrical length of the plunger circumference by approximately the width of the slot. Hence, the resonant wavelength of a higher order mode having a normal maximum of electric field near the position of the center of the slot will be decreased by an amount proportional to the width of the slot. It should be noted that this type of slot will have an effect on the resonant frequency even if it is not located near a maximum of electric field. If it is, for example, at a zero of field and a current maximum, it will behave just like a narrow slot, i. e., like the slot of Figure 9 of approximately the same depth, and it will increase the resonant wavelength of the higher order mode affected. The narrow slot, on the other hand, will not substantially affect the resonant frequency if it is located near a maximum of electric field, because the field can propagate past it. Thus, when using wide slots of the type shown in Figure 10, it is important to note their effect on higher order modes other than the one primarily sought to be controlled. It should be emphasized that this explanation of the action of the slots assumes a predetermined spatial orientation of field and current in the absence of slots for all plunger positions. In a rectangular or other non-circular line this requirement is met. In a conventional round line, there is no fixed orientation of the field and the particular orientation will be dependent on plunger position, constructional irregularities, wearing of parts, etc.

The operation of the slots of the circuit of Figures 5, 6, 7, and 8 can now be explained as follows: As stated previously, the slots 52 are introduced to make the 4-cycle plunger resonance decrease in frequency from its uncompensated value by an amount necessary to track the (3, 2) and (3, 3) modes of oscillation over the range of plunger positions 70 to 100. As seen in connection with Figure 9, this may be accomplished by use of a narrow slot located at a current maximum of the higher order mode to be affected, in this case the 4-cycle resonance. As seen from Figures 8 and 5, each of the slots 52 is aligned with a zero of electric field of the 4-cycle resonance and hence with a maximum of current. From Figure 7 it is seen that the depth of the slots 52 linearly decreases over the range of plunger positions 100 to 70, as required to produce a linearly decreasing resonant wavelength over this range of plunger positions. The slots 53 in the walls 12 operate according to the principles explained in connection with Figure 10. As seen from Figures 8 and 5, the slots 53 are located at maxima of electric field of the 4-cycle resonance. The width of the slots 53 increases linearly from plunger position 75 or so to about plunger position 30, as seen from Figure 7, as required to linearly decrease the resonant wavelength over this range of plunger positions. From plunger positions 75 to 70, both slots 53 and 52 are active, but the effect of 52 is dominant, so the resonant wavelength continues to be greater than the uncompensated value in this region. From about 70 to 58 plunger positions, both slots 53 and 52 are active, but here slots 53 are dominant.

The other slots, 51 and 54, are provided to tune the 2 and 4-cycle plunger resonances out of the frequency range of the desired modes of oscillation (2, 1) and (2, 2) over the ranges of plunger positions where interference can occur. These slots have no effect on the undesired modes of oscillation and are not oscillation mode suppressor slots. The slots 51 are of the type shown in Figure 9 and located at zeros of electric field for the 2-cycle resonance and thus at current maxima for this resonance, as seen from Figures 5 and 8. The depth of the 51 slots varies according to the arc of a circle over the range of plunger positions from 60 to 100. This particular variation was chosen merely to permit easy machining. It produces a compensated 2-cycle resonance curve as shown in Figure 4 which has an increased resonant wavelength over the specified range of plunger positions. All that is important is that the 2-cycle resonance be sufficiently removed in wavelength from the (2, 1) mode of oscillation to prevent interference, and any suitably deep slot would be adequate. It is to be noted that these slots 51 will not affect the 4-cycle plunger resonance at all since the 51 slots occur at a current zero and electric field maximum for this mode, as seen from Figures 5 and 8.

The slots 54 are located at a maximum of electric field for the 4-cycle resonance and are active over the range of plunger positions from 0 to about 30. These slots are of the type shown in Figure 10 and, in combination with the slots 53, are designed to decrease the resonant wavelength of the 4-cycle plunger resonance. The dotted line near 3 cm. in Figure 4 is the resulting resonant wavelength for the compensated 4-cycle resonance. Again the particular shape of the slots 54 was chosen for easy machining and any other slot as wide and deep would be as effective in preventing interference with the (2, 2) mode by the 4-cycle resonance. Before compensation it is seen from Figure 4 that the 4-cycle resonance crossed the (2, 2) mode at a plunger position of about 10 with a resulting "hole" in the oscillation. The two sets of slots 53 and 54 effectively remove this hole. Both sets of slots are fairly wide and each set has the same type of effect in this range of plunger positions, i. e. to decrease the 4-cycle resonant wavelength. Both slots 53 and 54 also affect the 2-cycle resonant wavelength, but their effects on this mode tend to cancel each other. The slots 54 are located at zeros of electric field and hence at current maxima for the 2-cycle resonance. Thus, their effect on this resonance is the same as the slots of Figure 9, i. e. to increase the resonant wavelength, although their effect on the 4-cycle resonance was that of the Figure 10 slots. The slots 53, on the other hand, are located at maxima of electric field for both the 2 and 4-cycle resonances, and will thus behave like Figure 10 slots for both resonances, i. e. they will decrease the resonance of the wavelength. If the effect of the 53 slots is dominant, the compensated 2-cycle resonance will be as shown in Figure 4. If the two effects exactly cancelled each other, the curve would be the same as for the uncompensated wavelength in this range of plunger positions, etc.

The specific circuit described above illustrates a slotting arrangement according to this invention. Only two types of slots are employed and these slots are located at current or electric field maxima, depending on the desired effect. The narrow slots of the 51 and 52 type are introduced in such a way as to appreciably affect only one higher order circumferential resonance, while the 53 and 54 type affect all higher order resonances present in the cavity. By a combination of these slots it has been shown that, in regions of plunger positions where undesired oscillation modes are present, the higher order circumferential plunger resonances may be made to track the undesired modes of oscillation and suppress them. In regions where interference with a desired mode of oscillation occurs, the interfering circumferential resonance can be removed to a non-interfering range of frequencies.

In order to obtain the results desired the following factors are deemed to be important: first, a non-circular cavity to provide stable and predetermined orientation of all circumferentially varying modes of wave propagation; second, a circumference such as to have higher order circumferential resonances in approximately the ranges of frequencies of the undesired modes of oscillation to be suppressed. The first requirement is met by the oscillator of Figure 1 by choosing a rectangular cross-section for the outer conductor, but other similar shapes can be used. The second requirement is met by choosing the circumference of the outer conductor so that the 4-cycle plunger resonance falls at approximately the center of the frequency range of the undesired (3, 2) and (3, 3) modes of oscillation.

Although the circuit described has been a reflex klystron oscillator, a multiple cavity klystron often exhibits undesired modes of oscillation which can be controlled in the same way. In any application in which a wide tuning range coaxial line resonator is desired, the proposed combination of a non-circular line, a non-contacting plunger and the slotting arrangement described provide a method of predictable control over higher order circumferential plunger resonances to damp out any undesired interaction phenomenon over wide frequency ranges.

We claim:

1. A tunable cavity resonator comprising a coaxial line having an outer conductor of generally rectangular cross section and an inner conductor, said outer conductor having a conducting wall at one end, a movable non-contacting plunger having an outer surface of substantially the same shape as said outer conductor and inner surface of substantially the same shape as said inner conductor, said plunger being movable axially along said coaxial line to adjust the resonant wavelength, and means for shifting the resonant wavelength of higher order circumferential resonances associated with the outer circumference of said plunger and having an even number of wavelengths per outer circumference of said plunger from the uncompensated resonant wavelength to a desired wavelength according to the position of said plunger, said wavelength shifting means including at least one slot cut substantially parallel to the axis of said coaxial line in said outer conductor.

2. A tunable cavity resonator comprising a coaxial line having an outer conductor of generally rectangular cross-section and an inner conductor, said outer conductor having a conducting plane wall at one end, a movable non-contacting plunger having an outer surface of substantially the same shape as said outer conductor and an inner surface of substantially the same shape as said inner conductor, said plunger being movable axially along said coaxial line to adjust the resonant wavelength, and means for shifting the resonant wave length of higher order circumferential resonances associated with the outer circumference of said plunger and having an even number of wavelengths per outer circumference of said plunger from the uncompensated resonant wavelength to a desired wavelength according to the position of said plunger, said wavelength shifting means including at least one slot cut substantially parallel to the axis of said coaxial line in said outer conductor, said slot having a cross-sectional dimension at any given position of said plunger proportional to the difference in wavelength between the desired wavelength and the uncompensated resonant wavelength associated with the circumference of said plunger.

3. A tunable cavity resonator comprising a coaxial line having an outer conductor of generally rectangular cross section and an inner conductor, said outer conductor having a conducting plane wall at one end, a movable non-contacting plunger having an outer surface of substantially the same shape as said outer conductor and an inner surface of substantially the same shape as said inner conductor, said plunger being movable axially along said coaxial line to adjust the resonant wavelength, and means for increasing the resonant wavelength of higher order circumferential resonances associated with the outer circumference of said plunger and having an even number of wavelengths per outer circumference of said plunger from the uncompensated resonant wavelength to a desired wavelength according to the position of said plunger, said wavelength increasing means including at least one slot cut substantially parallel to the axis of said coaxial line in said outer conductor and located around the circumference of said outer conductor near current maxima associated with said higher order circumferential resonance, said slot having a width small in comparison with a wavelength around said outer circumference of said plunger and having a depth at any given plunger position proportional to the difference in wavelength between the desired wavelength and the uncompensated resonant wavelength associated with the outer circumference of said plunger.

4. A tunable cavity resonator comprising a coaxial line having an outer conductor of generally rectangular cross section and an inner conductor, said outer conductor having a conducting plane wall at one end, a movable non-contacting plunger having an outer surface of substantially the same shape as said outer conductor and an inner surface of substantially the same shape as said inner conductor, said plunger being movable axially along said coaxial line to adjust the resonant wavelength, and means for decreasing the resonant wavelength of higher order circumferential modes associated with the outer circumference of said plunger and having an even number of wavelengths per outer circumference of said plunger from the uncompensated wavelength to a desired wavelength according to the position of said plunger, said wavelength decreasing means including at least one slot cut substantially parallel to the axis of said coaxial line in said outer conductor and located around the circumference of said outer conductor near maxima of electric field associated with said higher order circumferential resonance, said slot having a depth considerably greater than the spacing between said outer conductor and said outer surface of said plunger and a width at any given position of said plunger proportional to the difference in wavelength between the desired wavelength and the uncompensated resonant wavelength associated with the outer circumference of said plunger.

5. A tunable cavity resonator comprising a coaxial line having an outer conductor of generally rectangular cross section and an inner conductor, said outer conductor having a conducting plane wall at one end, a movable non-contacting plunger having an outer surface of substantially the same shape as said outer conductor and an inner surface of substantially the same shape as said inner conductor, said plunger being movable axially along said coaxial line to adjust the resonant wavelength, and means for selectively increasing and decreasing the resonant wavelength of higher order circumferential modes associated with the outer circumference of said plunger and having an even number of wavelengths per outer circumference of said plunger from the uncompensated wavelength to a desired wavelength according to the position of said plunger, said wavelength increasing means including a first set of slots cut substantially parallel to the axis of said coaxial line in said outer conductor, each of said first set of slots being located around the circumference of said outer conductor near current maxima associated with said higher order circumferential resonance, and each of said first slots having a width small in comparison with a wavelength around said outer circumference of said plunger and a depth at any given position of said plunger proportional to the difference between the desired wavelength and the uncompensated resonant wavelength associated with the outer circumference of said plunger, and said wavelength decreasing means including a second set of slots cut substantially parallel to the axis of said coaxial line in said outer conductor, each of said second set of slots being located around the circumference of said outer conductor near maxima of electric field associated with said higher order circumferential resonance, and each of said second slots having a depth considerably greater than the spacing between said outer conductor and said outer surface of said plunger and a width at any given position of said plunger proportional to the difference in wavelength between the desired wavelength and the uncompensated resonant wavelength associated with the outer circumference of said plunger.

6. In a variable frequency oscillation generator of the type comprising a reflex klystron tube having a cathode, control and resonator grids and a repeller, and a tunable cavity resonator coupled to said tube for generation of oscillations, said resonator comprising a coaxial line having an outer conductor of generally rectangular cross section connected to one resonator grid and an inner conductor connected to the other resonator grid, said outer conductor having a conducting wall at one end, a movable non-contacting plunger having an outer surface substantially the same shape as the said outer conductor and an inner surface of substantially the same shape as the said inner conductor, said plunger being movable axially along said coaxial line to adjust the resonant wavelength, and means for shifting the resonant wavelength of the higher order circumferential resonances associated with the outer circumference of said plunger and having an even number of wavelengths per outer circumference of said plunger from the uncompensated resonant wavelength to a desired wavelength according to the position of the plunger, said wavelength shifting means including at least one slot cut substantially parallel to the axis of said coaxial line in said outer conductor.

7. In a high frequency oscillation generator, of the type comprising a reflex klystron tube having cathode, control and resonator grids and a repeller, and a tunable cavity resonator coupled to said tube for generation of oscillations, said resonator comprising a coaxial line having an outer conductor of generally rectangular cross section connected to one resonator grid and an inner conductor connected to the other resonator grid, said outer conductor having a conducting plane wall at one end, a movable non-contacting plunger having an outer surface of substantially the same shape as said outer conductor and an inner surface of substantially the same shape as said inner conductor, said plunger being movable axially along said coaxial line to adjust the resonant wavelength, and means for shifting the resonant wavelength of higher order circumferential resonances associated with the outer circumference of said plunger and having an even number of wavelengths per outer circumference of said plunger from the uncompensated resonant wavelength to a desired wavelength according to the position of said plunger, said wavelength shifting means including at least one slot cut substantially parallel to the axis of said coaxial line in said outer conductor, said slot having a cross-sectional dimension at one given position of said plunger proportional to the difference in wavelength between the desired wavelength and uncompensated resonant wavelength associated with the circumference of the plunger.

8. In a variable high frequency oscillation generator of the type comprising a reflex klystron vacuum tube having cathode, control and resonator grids and a repeller, and a tunable cavity resonator coupled to said tube for generation of oscillations, said resonator comprising a coaxial line having an outer conductor of generally rectangular cross section connected to one resonator grid and an inner conductor connected to the other resonator grid, said outer conductor having a conducting plane wall at one end, a movable non-contacting plunger having an outer surface of substantially the same shape as said outer conductor and an inner surface of substantially the same shape as said inner conductor, said plunger being movable axially along said coaxial line to adjust the resonant wavelength, and means for increasing the resonant wavelength of higher order circumferential resonances associated with the outer circumference of said plunger and having an even number of wavelength lengths per outer circumference of said plunger from the uncompensated resonant wavelength to a desired wavelength according to the position of said plunger, said wavelength increasing means including at least one slot cut substantially parallel to the axis of said coaxial line and said outer conductor and located around the circumference of said outer conductor near current maxima associated with said higher order circumferential resonance, said slot having a width small in comparison with a wavelength around said outer circumference of said plungers and having a depth at any given plunger position proportional to the difference in wavelength between the desired wavelength and the uncompensated resonant wavelength associated with the outer circumference of said plunger.

9. In a variable high frequency oscillation generator of the type comprising a reflex klystron vacuum tube having cathode, control and resonator grids and a repeller, and a tunable cavity resonator coupled to said tube for generation of oscillations, said resonator comprising a coaxial line having an outer conductor of generally rectangular cross section connected to one resonator grid and an inner conductor connected to the other resonator grid, said outer conductor having a conducting plane wall at one end, a movable non-contacting plunger having an outer surface of substantially the same shape as said outer conductor and an inner surface of substantially the same shape as said inner conductor, said plunger being movable axially along said coaxial line to adjust the resonance wavelength, and means for decreasing the resonant wavelength of higher order circumferential modes associated with the outer circumference of said plunger and having an even number of wavelengths per outer circumference of said plunger from the uncompensated wavelengths to a desired wavelength according to the position of said plunger, said wavelength decreasing means including at least one slot cut substantially parallel to the axis of said coaxial line in said outer conductor and located around the circumference of said outer conductor near maxima of electric field associated with said high order circumferential resonance, said slot having a depth considerably greater than the spacing between said outer conductor and said outer surface of said plunger and a width at any given position of said plunger proportional to the difference in wavelength between the desired wavelength and the uncompensated resonant wavelength associated with the outer circumference of said plunger.

10. In a variable high frequency oscillation generator of the type comprising a reflex klystron vacuum tube having cathode, control and resonator grids and a repeller, and a tunable cavity resonator coupled to said tube for generation of oscillations, said tunable cavity resonator comprising a coaxial line having an outer conductor of generally rectangular cross section connected to one resonator grid and an inner conductor connected to the other resonator grid, said outer conductor having a conducting plane wall at one end, a movable non-contacting plunger having an outer surface of substantially the same shape as said outer conductor and an inner surface of substantially the same shape as said inner conductor, said plunger being movable axially along said coaxial line to adjust the resonant wavelengths, means for selectively increasing and decreasing the resonant wavelength of higher order circumferential modes associated with the outer circumference of said plunger and having an even number of wavelengths per outer circumference of said plunger from the uncompensated wavelength to a desired wavelength according to the position of said plunger, said wavelength increasing means including a first set of slots cut substantially parallel to the axis of said coaxial line in said outer conductor, each of said first set of slots being located around the circumference of said outer conductor near current maximum associated with said higher order circumferential resonance, and each of said first slots having a width small in comparison with a wavelength around said outer circumference of said plunger and a depth at any given position of said plunger proportional to the difference between the desired wavelength and the uncompensated resonant wavelength associated with the outer circumference of said plunger, and said wavelength decreasing means including a second set of slots cut substantially parallel to the axis of said coaxial line in said outer conductor, each of said second set of slots being located around the circumference of said outer conductor near maxima of electric field associated with said higher order circumferential resonance, and each of said second set of slots having a depth considerably greater than the spacing between said outer conductor and said outer surface of said plunger and a width at any given second position of said plunger proportional to the difference between the wavelength of said undesired mode of oscillation and the uncompensated resonant wavelength associated with the outer circumference of said plunger.

References Cited in the file of this patent

UNITED STATES PATENTS

| | | |
|---|---|---|
| 2,427,558 | Jensen | Sept. 16, 1947 |
| 2,527,619 | Brehm | Oct. 31, 1950 |
| 2,644,889 | Finke et al. | July 7, 1953 |
| 2,652,511 | Hewlett et al. | Sept. 15, 1953 |
| 2,659,025 | Huggins | Nov. 10, 1953 |

OTHER REFERENCES

Radio Engineers, Federal Telephone and Radio Corporation New York, Third Edition, 1949.

Disclaimer 2,747,098.—*William D. Myers*, Los Altos, and *Howard M. Zeidler*, Palo Alto, Calif. HIGH FREQUENCY OSCILLATOR AND RESONATOR. Patent dated May 22, 1956. Disclaimer filed June 27, 1962, by the assignee, *Hewlett-Packard Company*.

Hereby enters this disclaimer to claims 1 and 6 of said patent.

[*Official Gazette August 7, 1962.*]